(12) United States Patent
Saitoh et al.

(10) Patent No.: US 9,793,365 B2
(45) Date of Patent: Oct. 17, 2017

(54) METHOD FOR MANUFACTURING SILICON CARBIDE SEMICONDUCTOR DEVICE HAVING TRENCH

(71) Applicant: Sumitomo Electric Industries, Ltd., Osaka-shi (JP)

(72) Inventors: Yu Saitoh, Osaka (JP); Takeyoshi Masuda, Osaka (JP); Kenji Hiratsuka, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/784,272

(22) PCT Filed: Mar. 5, 2014

(86) PCT No.: PCT/JP2014/055566
§ 371 (c)(1),
(2) Date: Oct. 13, 2015

(87) PCT Pub. No.: WO2014/171211
PCT Pub. Date: Oct. 23, 2014

(65) Prior Publication Data
US 2016/0049485 A1   Feb. 18, 2016

(30) Foreign Application Priority Data

Apr. 16, 2013  (JP) .................. 2013-085528

(51) Int. Cl.
*H01L 29/80*   (2006.01)
*H01L 21/335*  (2006.01)
(Continued)

(52) U.S. Cl.
CPC .... *H01L 29/4236* (2013.01); *H01L 21/02236* (2013.01); *H01L 21/02238* (2013.01);
(Continued)

(58) Field of Classification Search
CPC ......... H01L 27/10823; H01L 27/10876; H01L 29/7813; H01L 29/7825; H01L 29/66734;
(Continued)

(56) References Cited

U.S. PATENT DOCUMENTS 5,915,180 A * 6/1999 Hara ................... H01L 29/1608
257/328
8,436,397 B2 * 5/2013 Shimizu ............ H01L 29/42316
257/134
(Continued)

FOREIGN PATENT DOCUMENTS

EP    1 981 076 A1    10/2008
JP    H07-273323 A    10/1995
(Continued)

OTHER PUBLICATIONS

International Search Report in International Application No. PCT/JP2014/055566, dated May 20, 2014.
(Continued)

*Primary Examiner* — Benjamin Sandvik
*Assistant Examiner* — Damon Hillman
(74) *Attorney, Agent, or Firm* — Venable LLP; Michael A. Sartori; Laura G. Remus

(57) ABSTRACT

A trench having an opening and a corner portion is formed in a silicon carbide substrate. A corner insulating film is formed to cover the corner portion. A gate insulating film is formed to cover a region extending from the opening to the corner portion. The step of forming the gate insulating film includes a step of thermally oxidizing the trench provided with the corner insulating film. The step of thermally oxidizing the trench includes a step of heating the silicon carbide substrate at not less than 1300° C. Accordingly, sufficient insulation reliability of the gate insulating film is secured near the opening of the trench while preventing (Continued)

dielectric breakdown of the gate oxide film at the bottom portion of the trench.

15 Claims, 13 Drawing Sheets

(51) Int. Cl.
H01L 29/423 (2006.01)
H01L 21/02 (2006.01)
H01L 29/66 (2006.01)
H01L 29/78 (2006.01)
H01L 29/16 (2006.01)
H01L 21/04 (2006.01)
H01L 21/311 (2006.01)
H01L 29/04 (2006.01)

(52) U.S. Cl.
CPC ...... H01L 21/02255 (2013.01); H01L 21/049 (2013.01); H01L 21/31111 (2013.01); H01L 21/31144 (2013.01); H01L 29/1608 (2013.01); H01L 29/42368 (2013.01); H01L 29/66068 (2013.01); H01L 29/7813 (2013.01); *H01L 29/045* (2013.01)

(58) Field of Classification Search
CPC ........... H01L 27/10864; H01L 29/4236; H01L 29/7397; H01L 29/7819
See application file for complete search history.

(56) References Cited

U.S. PATENT DOCUMENTS

| 9,024,357 | B2* | 5/2015 | Puglisi .............. H01L 29/66462 257/194 |
|---|---|---|---|
| 2001/0026961 | A1 | 10/2001 | Williams et al. |
| 2002/0153558 | A1 | 10/2002 | Takemori et al. |
| 2003/0089946 | A1 | 5/2003 | Hshieh et al. |
| 2004/0188756 | A1 | 9/2004 | Matsuda |
| 2004/0203200 | A1 | 10/2004 | Williams et al. |
| 2006/0091456 | A1 | 5/2006 | Montgomery |
| 2007/0045631 | A1 | 3/2007 | Endo et al. |
| 2007/0290260 | A1 | 12/2007 | Adan |
| 2010/0059816 | A1 | 3/2010 | Shimada et al. |
| 2012/0009801 | A1 | 1/2012 | Tanioka et al. |
| 2012/0037983 | A1 | 2/2012 | Hshieh |
| 2012/0292693 | A1 | 11/2012 | Lee et al. |
| 2013/0023113 | A1 | 1/2013 | Masuda et al. |
| 2013/0306982 | A1 | 11/2013 | Kudou |

FOREIGN PATENT DOCUMENTS

| JP | 07-326755 A | 12/1995 |
|---|---|---|
| JP | H11-067757 A | 3/1999 |
| JP | 2002-299619 A | 10/2002 |
| JP | 2003-509836 A | 3/2003 |
| JP | 2004-303802 A | 10/2004 |
| JP | 2005-019668 A | 1/2005 |
| JP | 2005-510087 A | 4/2005 |
| JP | 2006-269924 A | 10/2006 |
| JP | 2006-344760 A | 12/2006 |
| JP | 2007-103729 A | 4/2007 |
| JP | 2008-519436 A | 6/2008 |
| JP | 2009-088188 A | 4/2009 |
| JP | 2011-216651 A | 10/2011 |
| JP | 2012-038771 A | 2/2012 |
| JP | 2012-039127 A | 2/2012 |
| JP | 2012-216675 A | 11/2012 |
| JP | 2013-026372 A | 2/2013 |
| WO | 2012/098861 A1 | 7/2012 |
| WO | 2012/127821 A1 | 9/2012 |

OTHER PUBLICATIONS

Notice of Grounds of Rejection in Japanese Patent Application No. 2013-085528, dated Jun. 21, 2016.
Extended European Search Report in counterpart European Patent Application No. 14784819.6, dated Oct. 31, 2016.
Notice of Grounds of Rejection in counterpart Japanese Patent Application No. 2013-085528, dated Jan. 31, 2017.

* cited by examiner (11-20)
(01-10)

(0-11-2)

METHOD FOR MANUFACTURING SILICON CARBIDE SEMICONDUCTOR DEVICE HAVING TRENCH

TECHNICAL FIELD

The present invention relates to a method for manufacturing a silicon carbide semiconductor device, in particular, a method for manufacturing a silicon carbide semiconductor device having a trench.

BACKGROUND ART

As a silicon carbide semiconductor device, Japanese Patent Laying-Open No. 7-326755 (Patent Document 1) discloses a trench gate type MOSFET (Metal Oxide Semiconductor Field Effect Transistor) employing a silicon carbide substrate, for example. According to this publication, in order to prevent dielectric breakdown of a gate oxide film at the bottom portion of a trench, the thickness of the gate thermal oxidation film at the bottom portion is made thicker than the thickness thereof at the side portion. Such a difference in thickness is caused by using crystal orientation dependence of oxidation rate.

CITATION LIST

Patent Document

PTD 1: Japanese Patent Laying-Open No. 7-326755

SUMMARY OF INVENTION

Technical Problem

In the technique described in the publication above, the thermal oxidation rate when forming the gate insulating film needs to have a sufficiently large crystal orientation dependence. In such a case, according to inspection by the present inventors, the thickness of the gate insulating film become thin locally at the opening of the trench. This results in low insulation reliability of the gate insulating film near the opening of the trench.

The present invention has been made to solve the problem described above, and has an object to provide a method for manufacturing a silicon carbide semiconductor device capable of securing sufficient insulation reliability of a gate insulating film near an opening of a trench while preventing dielectric breakdown of the gate oxide film at a bottom portion of the trench.

Solution to Problem

A method for manufacturing a silicon carbide semiconductor device in the present invention has the following steps.

There is prepared a silicon carbide substrate including a first semiconductor layer, a second semiconductor layer, and a third semiconductor layer, the first semiconductor layer having a first conductivity type, the second semiconductor layer being provided on the first semiconductor layer, the second semiconductor layer having a second conductivity type, the third semiconductor layer being provided on the second semiconductor layer, the third semiconductor layer being separated from the first semiconductor layer by the second semiconductor layer, the third semiconductor layer having the first conductivity type.

A trench having an opening in the silicon carbide substrate is formed. The trench includes a bottom surface and a side wall surface, the bottom surface being constituted of the first semiconductor layer, the side wall surface having first to third side surfaces respectively constituted of the first to third semiconductor layers. The trench has a corner portion formed by the first side surface and the bottom surface meeting each other.

A corner insulating film is formed to cover the corner portion and expose a region extending from the opening onto the second side surface.

A gate insulating film is formed to cover a region extending from the opening to the corner portion. The step of forming the gate insulating film includes a step of thermally oxidizing the trench provided with the corner insulating film. The step of thermally oxidizing the trench includes a step of heating the silicon carbide substrate at not less than 1300° C.

A gate electrode is formed on the trench with the gate insulating film being interposed therebetween.

Advantageous Effects of Invention

According to the present invention, sufficient insulation reliability of the gate insulating film can be secured near the opening of the trench.

DESCRIPTION OF EMBODIMENTS

Figure 1:
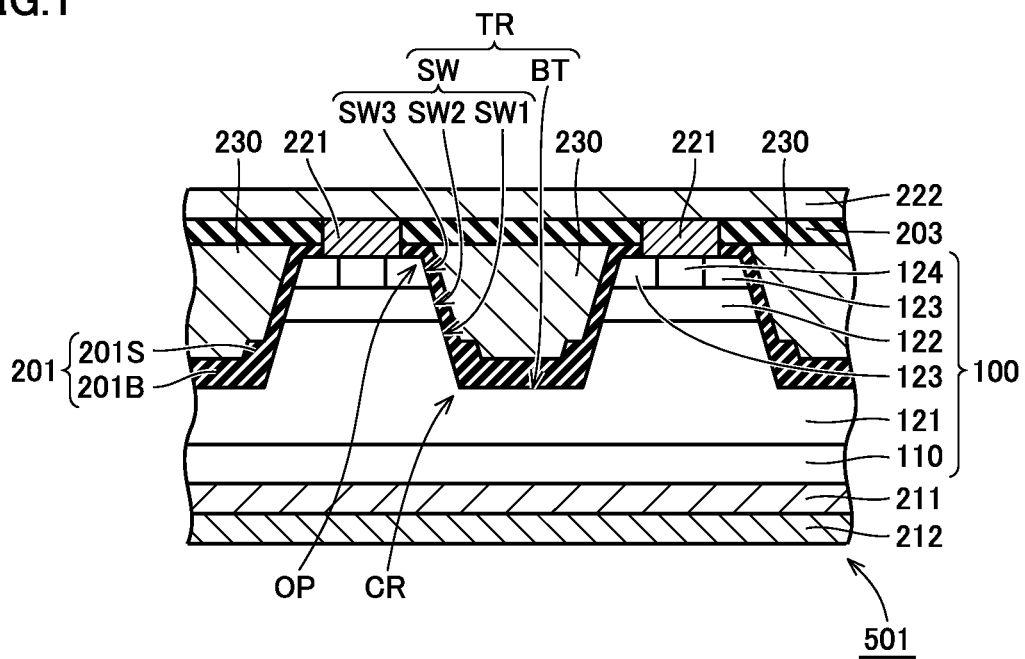
FIG. 1 is a partial cross sectional view schematically showing a configuration of a silicon carbide semiconductor device in a first embodiment of the present invention.

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

The following first describes an overview with regard to (i) to (x).

(i) A method for manufacturing a silicon carbide semiconductor device 501, 502 includes the following steps.

There is prepared a silicon carbide substrate 100 including a first semiconductor layer 121, a second semiconductor layer 122, and a third semiconductor layer 123, first semiconductor layer 121 having a first conductivity type, second semiconductor layer 122 being provided on first semiconductor layer 121, second semiconductor layer 122 having a second conductivity type, third semiconductor layer 123 being provided on second semiconductor layer 122, third semiconductor layer 123 being separated from first semiconductor layer 121 by second semiconductor layer 122, third semiconductor layer 123 having the first conductivity type.

A trench TR having an opening OP in silicon carbide substrate 100 is formed. Trench TR includes a bottom surface BT and a side wall surface SW, bottom surface BT being constituted of first semiconductor layer 121, side wall surface SW having first to third side surfaces SW1 to SW3 respectively constituted of first to third semiconductor layers 121 to 123. Trench TR has a corner portion CR formed by first side surface SW1 and bottom surface BT meeting each other.

A corner insulating film 201R is formed to cover corner portion CR and expose a region extending from opening OP onto second side surface SW2.

A gate insulating film 201 is formed to cover a region extending from opening OP to corner portion CR. The step of forming gate insulating film 201 includes a step of thermally oxidizing trench TR provided with corner insulating film 201R. The step of thermally oxidizing trench TR includes a step of heating silicon carbide substrate 100 at not less than 1300° C.

A gate electrode 230 is formed on trench TR with gate insulating film 201 being interposed therebetween.

According to the manufacturing method, gate insulating film 201 formed by thermally oxidizing trench TR provided with corner insulating film 201R is made thick at corner portion CR of trench TR by a thickness corresponding to the thickness of corner insulating film 201R. Therefore, corner portion CR does not need to be made thick by thermal oxidation. Thus, it is not necessary to actively cause a phenomenon in which the thermal oxidation rate differs depending on crystal orientation. Hence, there can be employed thermal oxidation at not less than 1300° C. at which such a phenomenon hardly takes place. By thus selecting the temperature of thermal oxidation, it is possible to suppress the phenomenon in which gate insulating film 201 becomes thin near opening OP of trench TR. Therefore, sufficient insulation reliability of the gate insulating film can be secured near opening OP.

(ii) In (i), the step of thermally oxidizing trench TR preferably includes the following steps.

A temperature of silicon carbide substrate 100 is increased from a temperature of less than 1300° C. to a temperature of not less than 1300° C. in a non-oxidizing atmosphere. An atmosphere surrounding silicon carbide substrate 100 is changed from the non-oxidizing atmosphere to an oxidizing atmosphere while maintaining the temperature of silicon carbide substrate 100 at not less than 1300° C.

Accordingly, the thermal oxidation can be more sufficiently performed at not less than 1300° C.

(iii) In (ii), the step of thermally oxidizing trench TR preferably includes the following steps.

The atmosphere surrounding silicon carbide substrate 100 is changed from the oxidizing atmosphere to the non-oxidizing atmosphere while maintaining the temperature of silicon carbide substrate 100 at not less than 1300° C. Silicon carbide substrate 100 is cooled from the temperature of not less than 1300° C. to a temperature of not more than 1000° C. while maintaining, as the non-oxidizing atmosphere, the atmosphere surrounding silicon carbide substrate 100.

Accordingly, the thermal oxidation can be more securely performed at not less than 1300° C.

(iv) In (ii) or (iii), the step of changing the atmosphere surrounding silicon carbide substrate 100 from the non-oxidizing atmosphere to the oxidizing atmosphere preferably includes a step of introducing oxygen gas into the atmosphere surrounding silicon carbide substrate 100.

In this way, the change can be made readily from the non-oxidizing atmosphere to the oxidizing atmosphere.

(v) In any one of (i) to (iv), the step of forming corner insulating film 201R preferably includes the following steps.

A covering insulating film 201Q is formed to cover the region extending from opening OP to corner portion CR. Covering insulating film 201Q is patterned.

In this way, corner insulating film 201R can be formed from the film covering the region extending from opening OP to corner portion CR.

(vi) In (v), the step of forming covering insulating film 201Q preferably includes the following steps.

A silicon film 302P is formed on trench TR. Silicon film 302P is thermally oxidized.

Accordingly, covering insulating film 201Q can be formed using silicon film 302P.

(vii) In (vi), the step of forming covering insulating film 201Q preferably includes a step of forming a thermal oxidation film 201P on trench TR before the step of forming silicon film 302P.

Accordingly, the portion formed from thermal oxidation film 201P can be included in covering insulating film 201Q. Therefore, covering insulating film 201Q can be made thicker.

(viii) In (vii), the step of thermally oxidizing silicon film 302P is preferably performed at less than 1300° C.

Accordingly, insulating property can be suppressed from being deteriorated due to generation of SiO by reaction between thermal oxidation film 201P and silicon film 302P.

(ix) In (v) to (viii), the step of patterning covering insulating film 201Q preferably includes the following steps.

A resist layer 402 is formed by applying a resist liquid to fill trench TR with covering insulating film 201Q being interposed therebetween.

Resist layer 402 is patterned by etching back resist layer 402 such that resist layer 402 partially remains on trench TR.

Covering insulating film 201Q is etched using resist layer 402 as a mask after patterning resist layer 402.

Accordingly, covering insulating film 201Q can be patterned readily.

(x) In (ix), the step of etching covering insulating film 201Q is preferably performed by wet etching.

Accordingly, the etching is performed by chemical etching rather than physical etching. Therefore, the etching does not provide physical damage to silicon carbide substrate 100.

Next, as more detailed description, the following describes first and second embodiments and supplementary matters thereof

First Embodiment

As shown in FIG. 1, a MOSFET 501 (silicon carbide semiconductor device) of the present embodiment includes an epitaxial substrate 100 (silicon carbide substrate), gate insulating films 201, gate electrodes 230, interlayer insulating films 203, source electrodes 221, a drain electrode 211, a source interconnection 222, and a protecting electrode 212.

Epitaxial substrate 100 is made of silicon carbide, and has a single-crystal substrate 110 and an epitaxial layer provided thereon. Single-crystal substrate 110 has n type conductivity (first conductivity type). The plane orientation (hklm) of one main surface (upper surface in FIG. 1) of single-crystal substrate 110 preferably has m of negative value, more preferably, is approximately a (000-1) plane.

Figure 2:
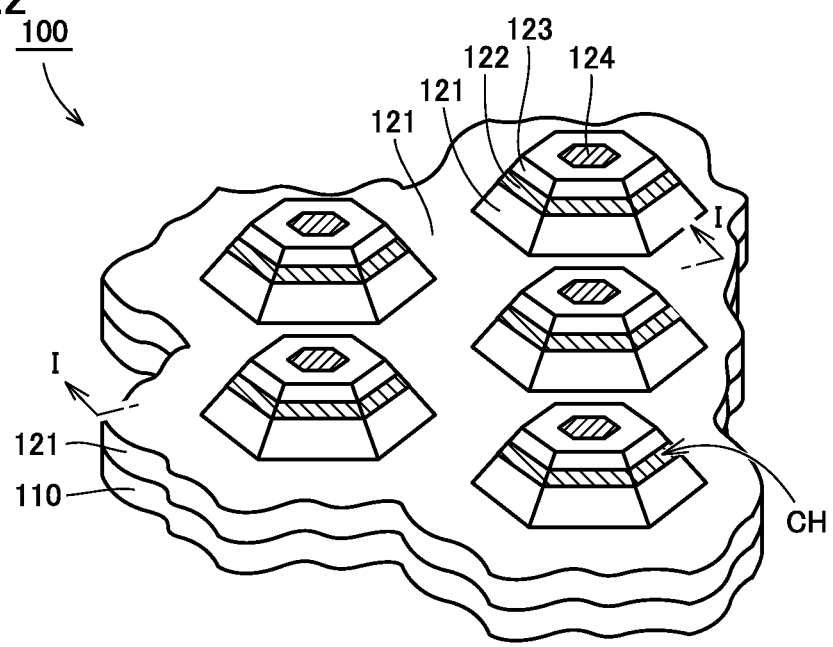
FIG. 2 is a perspective view schematically showing the shape of a silicon carbide substrate included in the silicon carbide semiconductor device of FIG. 1 with hatching being provided to a region of second conductivity type for viewability of the figure.

Further, with reference to FIG. 2, the epitaxial layer of epitaxial substrate 100 includes an n$^-$ layer 121 (first semiconductor layer), p type body layers 122 (second semiconductor layer), n regions 123 (third semiconductor layer), and contact regions 124. The silicon carbide of epitaxial substrate 100 preferably has a hexagonal crystal structure, more preferably, has polytype of 4H.

N$^-$ layer 121 has a donor added therein, and therefore has n type conductivity. The donor is preferably added to n$^-$ layer 121 by adding an impurity during epitaxial growth of n$^-$ layer 121, rather than ion implantation. N$^-$ layer 121 preferably has a donor concentration lower than that of single-crystal substrate 110. The donor concentration of n$^-$ layer 121 is preferably not less than $1\times10^{15}$ cm$^{-3}$ and not more than $5\times10^{16}$ cm$^{-3}$, for example, $8\times10^{15}$ cm$^{-3}$.

Each of p type body layers 122 is provided on n$^-$ layer 121, has an acceptor added therein, and therefore has p type conductivity (second conductivity type different from the first conductivity type). P type body layer 122 has an acceptor concentration of, for example, $1\times10^{18}$ cm$^{-3}$.

Each of n regions 123 has n type conductivity. N region 123 is provided on p type body layer 122, and is separated from n$^-$ layer 121 by p type body layer 122.

Each of contact regions 124 has p type conductivity. Contact region 124 is formed on a portion of p type body layer 122 so as to be connected to p type body layer 122.

Figure 3:
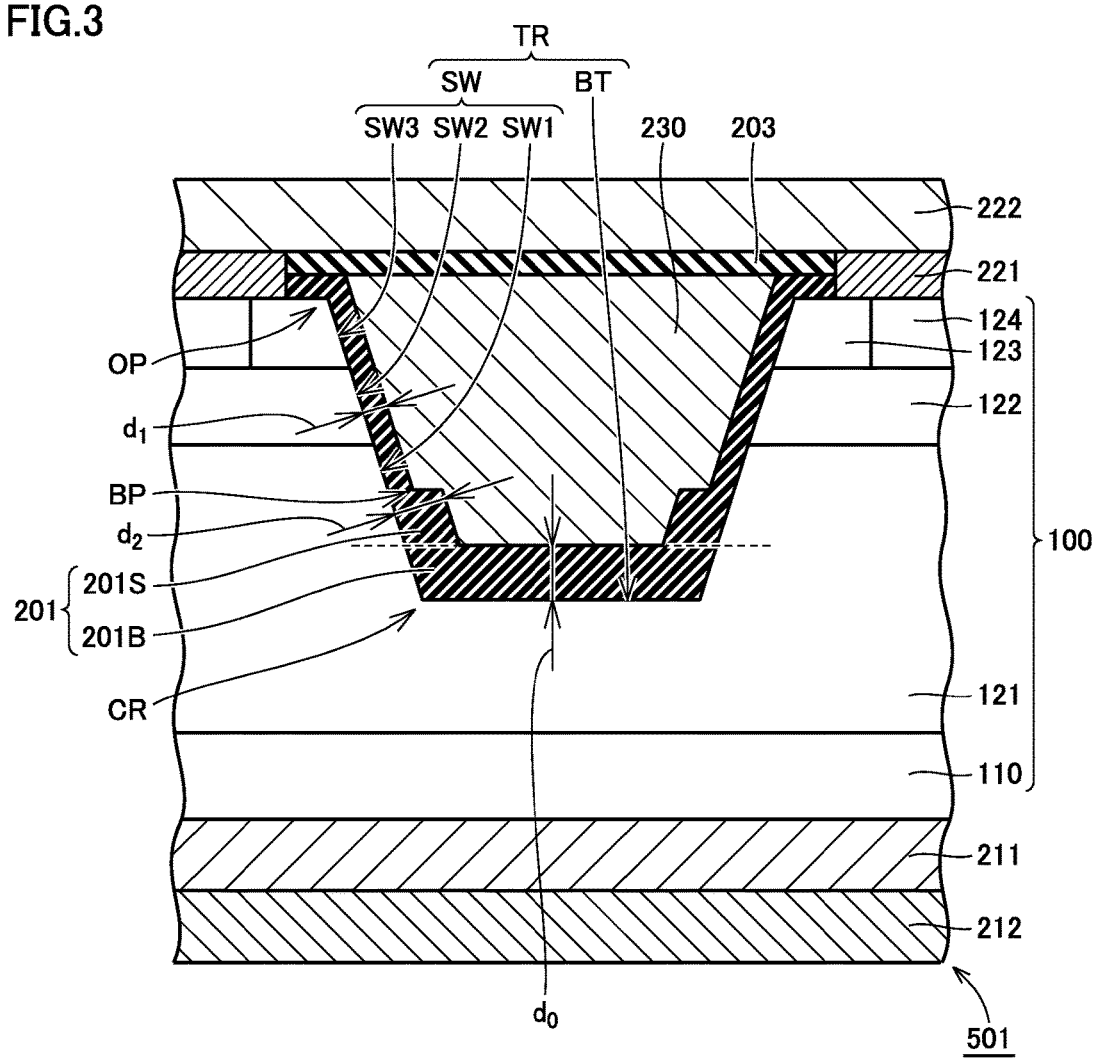
FIG. 3 is an enlarged view of FIG. 1.

With reference to FIG. 3, a trench TR having an opening OP is provided in the epitaxial layer of epitaxial substrate 100. Trench TR includes: a bottom surface BT constituted of n$^-$ layer 121; and a side wall surface SW having side surfaces SW1 to SW3 (first to third side surfaces). Side surfaces SW1 to SW3 are respectively constituted of n$^-$ layer 121, p type body layer 122, and n region 123.

Bottom surface BT is a flat surface substantially parallel to the main surface of epitaxial substrate 100. Trench TR has a corner portion CR formed by side surface SW1 and bottom surface BT meeting each other. Side surface SW2 has a function as a channel of the MOSFET. Preferably, side wall surface SW, in particular, side surface SW2 has a predetermined crystal plane (also referred to as "special plane"). Details of the special plane will be described later.

The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has upper surface and bottom surface both having a hexagonal shape, and has side walls inclined relative to the upper surface of single-crystal substrate 110. Accordingly, trench TR is expanded toward the opening side.

Gate insulating film 201 is provided on trench TR. Gate insulating film 201 separates epitaxial substrate 100 and gate electrode 230 from each other in trench TR. Gate insulating film 201 is preferably an oxide film, such as a silicon oxide film.

Gate insulating film 201 includes: a bottom portion 201B covering bottom surface BT; and a side wall portion 201S connected to bottom portion 201B and covering side wall surface SW. Bottom portion 201B has a thickness $d_0$. A portion of side wall portion 201S on side surface SW2 has a minimum thickness $d_1$. A portion, connected to bottom portion 201B, of side wall portion 201S on side surface SW1 has a thickness $d_2$. In the present embodiment, the portion having thickness $d_1$ and the portion having thickness $d_2$ are connected to each other at a boundary portion BP, which is a region in which a thickness is changed. In the present embodiment, boundary portion BP is located deeper (downward in the figure) than a boundary between side surfaces SW1 and SW2.

Regarding the above-described thickness, $d_2 > d_1$ is satisfied. Preferably, $d_0 > d_1$ is satisfied. Preferably, side wall portion 201S connects n⁻ layer 121 and n region 123 to each other on side surface SW2 by a portion having a thickness less than thickness $d_2$. Preferably, side wall portion 201S connects n⁻ layer 121 and n region 123 to each other on side surface SW2 by the portion having thickness $d_1$.

Gate electrode 230 is provided on trench TR with gate insulating film 201 being interposed therebetween. Namely, gate electrode 230 faces each of side surfaces SW1 to SW3 and bottom surface BT with gate insulating film 201 being interposed therebetween.

Source electrode 221 extends through interlayer insulating film 203 and is in contact with each of n region 123 and contact region 124. Source interconnection 222 is provided on source electrode 221 and interlayer insulating film 203 in contact with source electrode 221. Drain electrode 211 is provided on an opposite surface of epitaxial substrate 100 to its surface provided with trench TR. Protecting electrode 212 covers drain electrode 211.

The following describes a method for manufacturing MOSFET 501 (FIG. 1).

Figure 4:
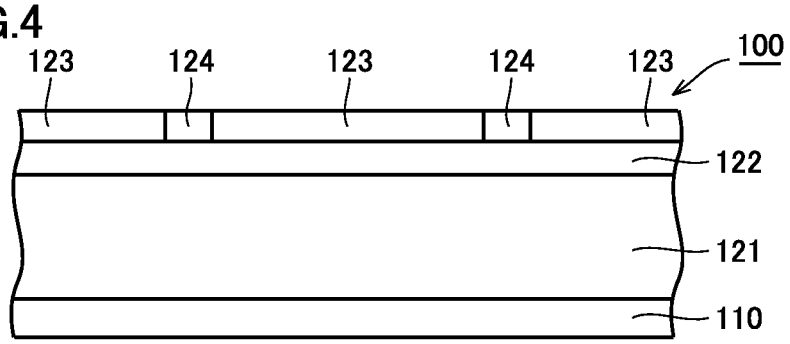
FIG. 4 is a partial cross sectional view schematically showing a first step of a method for manufacturing the silicon carbide semiconductor device of FIG. 1.

With reference to FIG. 4, on single-crystal substrate 110, n⁻ layer 121 is formed by means of epitaxial growth. This epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as donors, for example.

Next, p type body layer 122 is formed on n⁻ layer 121, and n region 123 is formed on p type body layer 122. Specifically, ions are implanted into the upper surface of n⁻ layer 121. In the ion implantation for forming p type body layer 122, ions of an acceptor such as aluminum (Al) are implanted. Meanwhile, in the ion implantation for forming n region 123, ions of a donor such as phosphorus (P) are implanted, for example. It should be noted that instead of the ion implantation, epitaxial growth involving addition of an impurity may be employed. Next, by means of ion implantation, contact regions 124 are formed.

Next, an activation heating treatment is performed to activate the impurities added by the ion implantation. This heating treatment is preferably performed at a temperature of not less than 1500° C. and not more than 1900° C., for example, a temperature of approximately 1700° C. The heating treatment is performed for approximately 30 minutes, for example. The atmosphere of the heating treatment is preferably an inert gas atmosphere, such as Ar atmosphere. In the manner described above, epitaxial substrate 100 is prepared.

Figure 5:
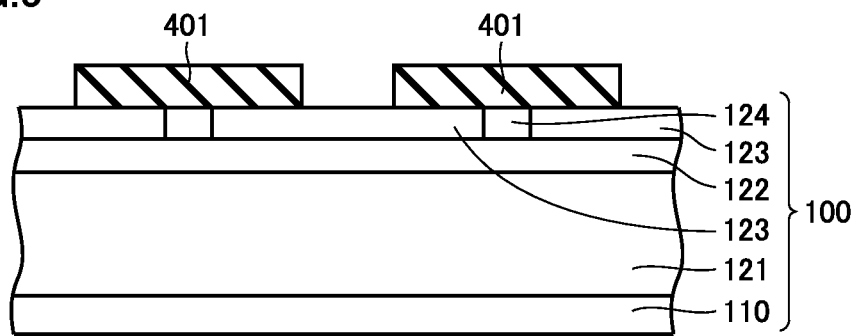
FIG. 5 is a partial cross sectional view schematically showing a second step of the method for manufacturing the silicon carbide semiconductor device of FIG. 1.

As shown in FIG. 5, a mask 401 having an opening partially exposing n region 123 is formed on epitaxial substrate 100. The opening is disposed in conformity with the position of trench TR (FIG. 1). As mask 401, a silicon oxide film formed by thermal oxidation can be used, for example.

Figure 6:
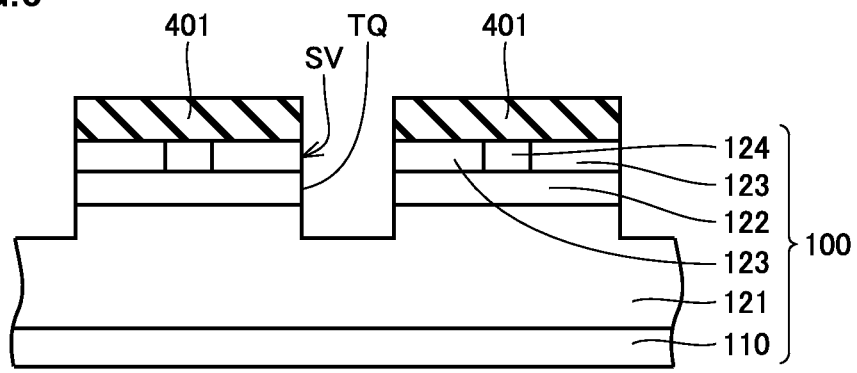
FIG. 6 is a partial cross sectional view schematically showing a third step of the method for manufacturing the silicon carbide semiconductor device of FIG. 1.

As shown in FIG. 6, in the opening of mask 401, n region 123, p type body layer 122, and portions of n⁻ layer 121 are removed by etching. An exemplary, usable etching method is reactive ion etching (ME), in particular, inductively coupled plasma (ICP) RIE. Specifically, for example, ICP-RIE can be used which employs $SF_6$ or a mixed gas of $SF_6$ and $O_2$ as the reaction gas. By means of such etching, in the region where trench TR (FIG. 1) is to be formed, a recess TQ can be formed which has a side wall having an inner surface SV substantially perpendicular to the main surface of single-crystal substrate 110.

Next, epitaxial substrate 100 is etched using mask 401. Specifically, inner surface SV of recess TQ of epitaxial substrate 100 is thermally etched. The thermal etching can be performed by, for example, heating epitaxial substrate 100 in an atmosphere containing a reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heating treatment temperature of, for example, not less than 700° C. and not more than 1000° C. Further, the reactive gas may contain a carrier gas. An exemplary, usable carrier gas is nitrogen ($N_2$) gas, argon gas, helium gas, or the like. When the heating treatment temperature is set at not less than 700° C. and not more than 1000° C. as described above, a rate of etching SiC is approximately, for example, 70 μm/hour. In addition, in this case, mask 401, which is formed of silicon oxide and therefore has a very large selection ratio relative to SiC, is not substantially etched during the etching of SiC.

Figure 7:
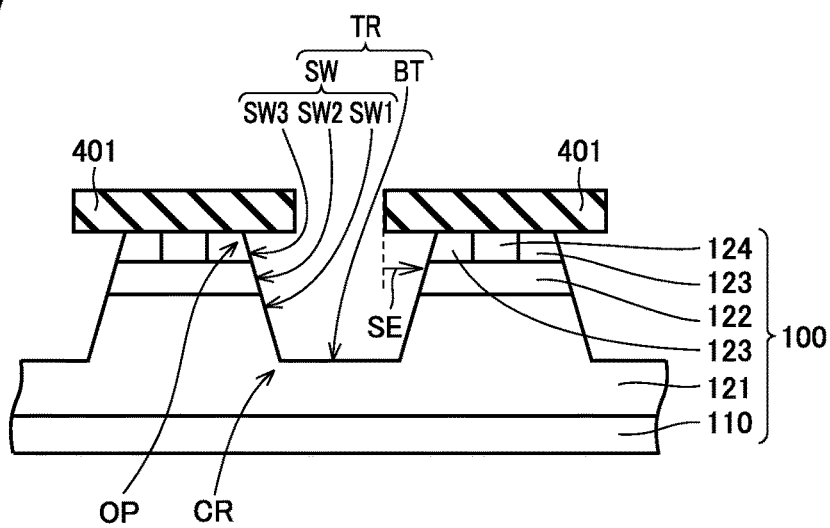
FIG. 7 is a partial cross sectional view schematically showing a fourth step of the method for manufacturing the silicon carbide semiconductor device of FIG. 1.
Figure 8:
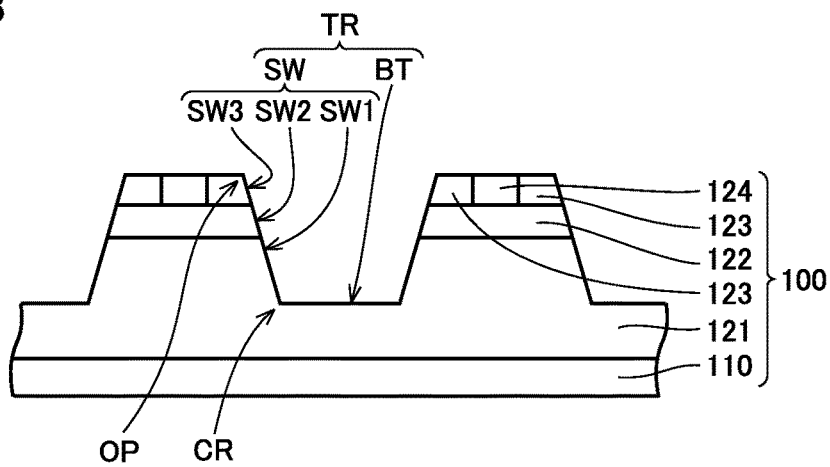
FIG. 8 is a partial cross sectional view schematically showing a fifth step of the method for manufacturing the silicon carbide semiconductor device of FIG. 1.

As shown in FIG. 7, trench TR is formed in the epitaxial layer of silicon carbide substrate 100 by the above-mentioned thermal etching. During the formation of trench TR, epitaxial substrate 100 is side-etched from the opening of mask 401 as indicated by an arrow SE. Further, during this thermal etching, a special plane is spontaneously formed on side wall surface SW of trench TR, in particular, on side surface SW2. Next, mask 401 is removed by wet etching, for example (FIG. 8). The wet etching can be performed using hydrofluoric acid, for example.

Figure 9:
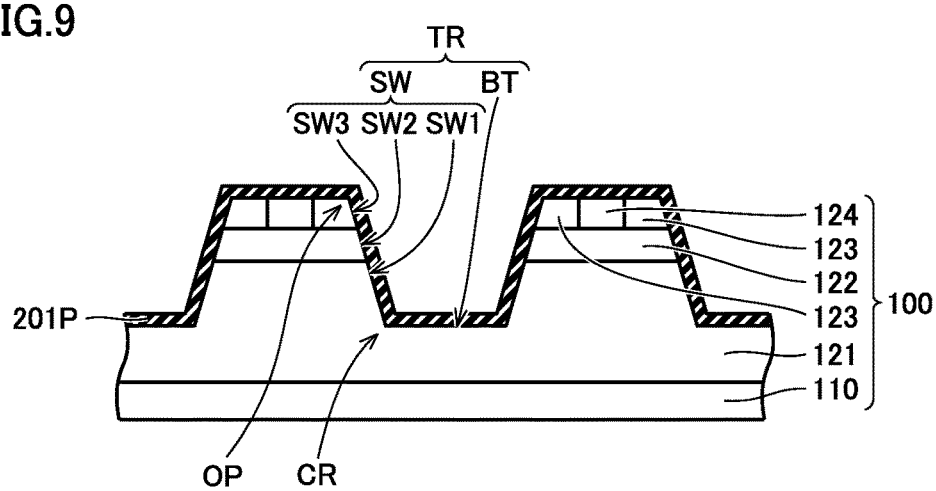
FIG. 9 is a partial cross sectional view schematically showing a sixth step of the method for manufacturing the silicon carbide semiconductor device of FIG. 1.

As shown in FIG. 9, thermal oxidation film 201P is formed on the trench by thermal oxidation of epitaxial substrate 100. The thermal oxidation may be performed at a temperature of less than 1300° C. or not less than 1300° C.

Figure 10:
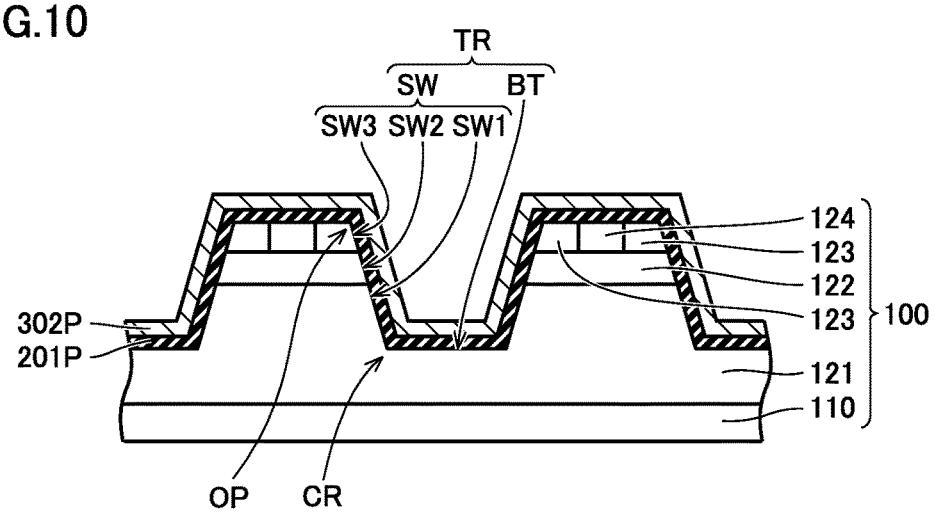
FIG. 10 is a partial cross sectional view schematically showing a seventh step of the method for manufacturing the silicon carbide semiconductor device of FIG. 1.
Figure 11:
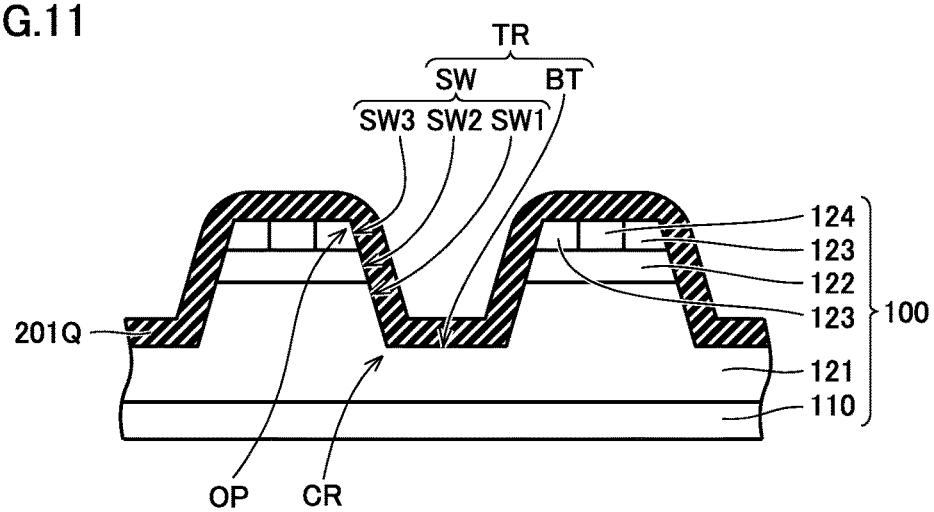
FIG. 11 is a partial cross sectional view schematically showing an eighth step of the method for manufacturing the silicon carbide semiconductor device of FIG. 1.

As shown in FIG. 10, silicon film 302P is formed to fill trench TR with thermal oxidation film 201 interposed therebetween. Silicon film 302P can be formed by the chemical vapor deposition (CVD) method, for example. Next, silicon film 302P is thermally oxidized. In this way, a covering insulating film 201Q (FIG. 11) is formed to cover a region extending from opening OP to corner portion CR. Silicon film 302P is preferably thermally oxidized at less than 1300° C., in particular, is more preferably thermally oxidized at less than 1100° C. Moreover, silicon film 302P is preferably thermally oxidized at more than 900° C., and is more preferably thermally oxidized at more than 1000° C.

Figure 12:
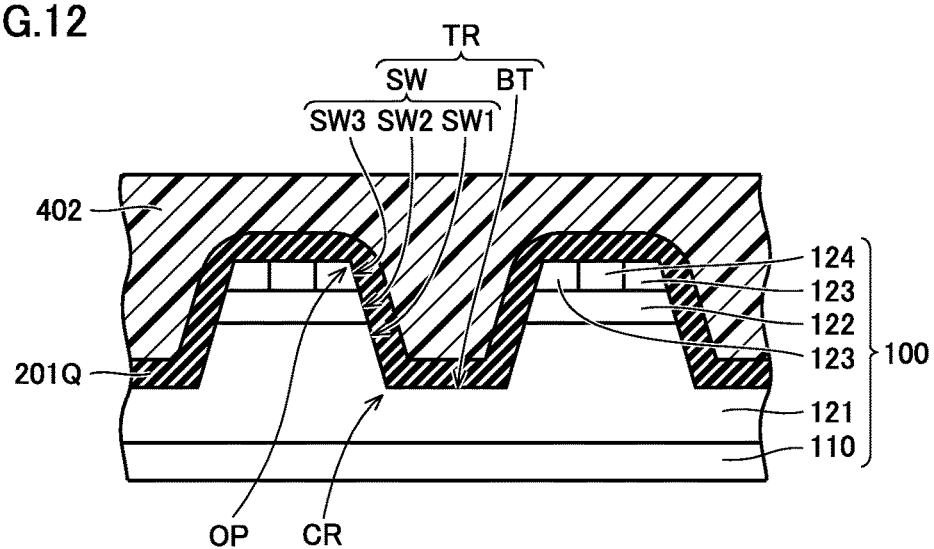
FIG. 12 is a partial cross sectional view schematically showing a ninth step of the method for manufacturing the silicon carbide semiconductor device of FIG. 1.
Figure 13:
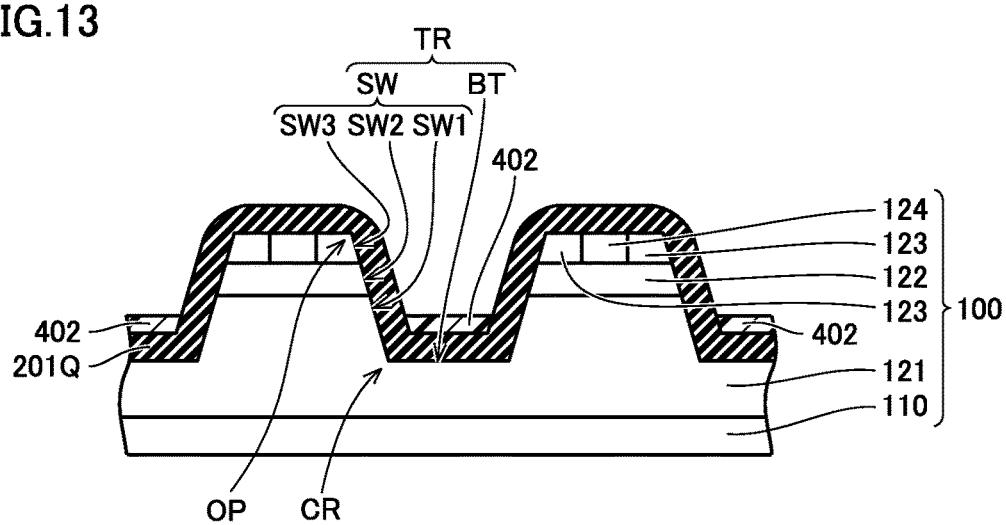
FIG. 13 is a partial cross sectional view schematically showing a tenth step of the method for manufacturing the silicon carbide semiconductor device of FIG. 1.

As shown in FIG. 12, a resist layer 402 is formed by applying a resist liquid to fill trench TR with covering insulating film 201Q being interposed therebetween. As shown in FIG. 13, by etching back resist layer 402, resist layer 402 is patterned such that resist layer 402 partially remains in trench TR. The etch back may be performed without using an etching mask. Resist layer 402 thus remaining covers corner portion CR with covering insulating film 201Q being interposed therebetween. After patterning resist layer 402, covering insulating film 201Q is etched using resist layer 402 as a mask. This etching is preferably performed by wet etching. The wet etching can be performed using hydrofluoric acid, for example.

Figure 14:
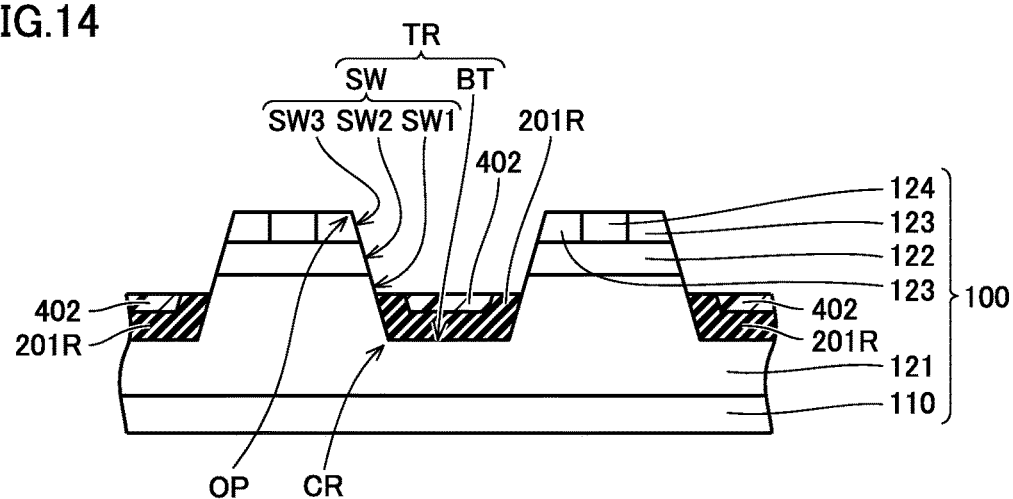
FIG. 14 is a partial cross sectional view schematically showing an eleventh step of the method for manufacturing the silicon carbide semiconductor device of FIG. 1.

With the steps of FIG. 12 and FIG. 13 as described above, covering insulating film 201Q is patterned. As a result, as shown in FIG. 14, corner insulating film 201R is formed to cover corner portion CR and expose the region extending from opening OP onto side surface SW2. Corner insulating film 201R covers corner portion CR, and at least partially expose side surface SW2. In the present embodiment, the whole of side surface SW2 is exposed and a portion of side surface SW1 in contact with side surface SW2 is also exposed.

Figure 15:
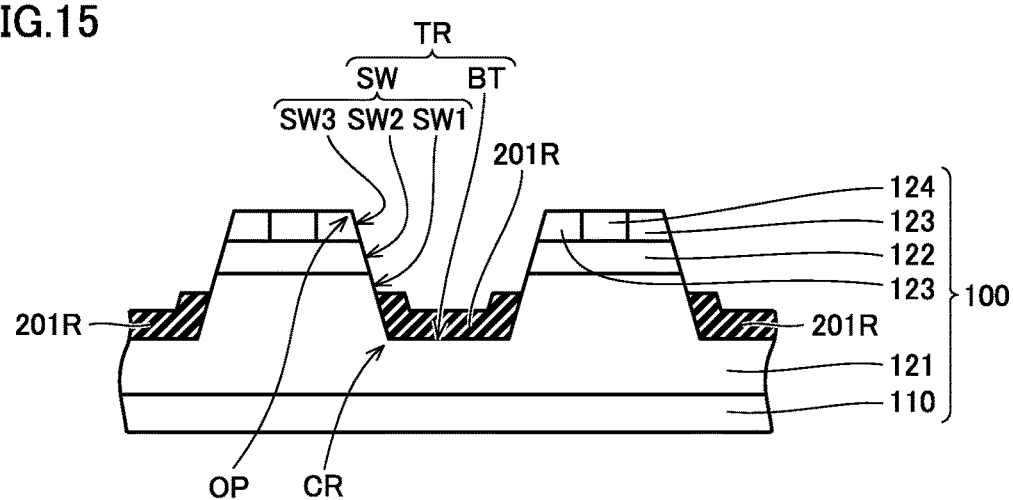
FIG. 15 is a partial cross sectional view schematically showing a twelfth step of the method for manufacturing the silicon carbide semiconductor device of FIG. 1.

As shown in FIG. 15, resist layer 402 (FIG. 14) is removed. Next, trench TR having corner insulating film 201R provided thereon is thermally oxidized. In the thermal oxidation, epitaxial substrate 100 is heated at not less than 1300° C. That is, the thermal oxidation is performed at not less than 1300° C. Specifically, it is preferable to perform the following steps for the thermal oxidation.

Figure 16:
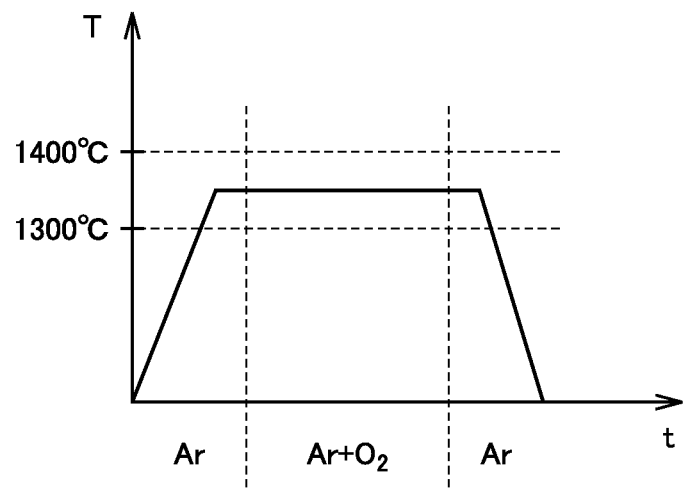
FIG. 16 is a graph showing an example of a process condition in a thirteenth step of the method for manufacturing the silicon carbide semiconductor device of FIG. 1.

With reference to FIG. 16, first, epitaxial substrate 100 is heated from a temperature of less than 1300° C. to a temperature of not less than 1300° C. in a non-oxidizing atmosphere. Preferably, epitaxial substrate 100 is heated from a temperature of less than 1000° C. (for example, about a room temperature) to a temperature of not less than 1300° C. in the non-oxidizing atmosphere. The non-oxidizing atmosphere is an Ar atmosphere, for example.

Next, while maintaining the temperature of epitaxial substrate 100 at not less than 1300° C., the atmosphere surrounding epitaxial substrate 100 is changed from the non-oxidizing atmosphere to an oxidizing atmosphere. Accordingly, epitaxial substrate 100 is thermally oxidized. This change can be made by introducing oxygen gas into the atmosphere surrounding epitaxial substrate 100. For example, the change can be made from Ar atmosphere to an atmosphere of mixture of Ar gas and $O_2$ (oxygen) gas.

Next, while maintaining the temperature of epitaxial substrate 100 at not less than 1300° C., the atmosphere surrounding epitaxial substrate 100 is changed from the oxidizing atmosphere to a non-oxidizing atmosphere. For example, a change is made from the atmosphere of mixture of Ar gas and $O_2$ gas to an Ar atmosphere. Next, while maintaining, as the non-oxidizing atmosphere, the atmosphere surrounding epitaxial substrate 100, epitaxial substrate 100 is cooled from the temperature of not less than 1300° C. to a temperature of not more than 1000° C. (for example, about a room temperature).

Figure 17:
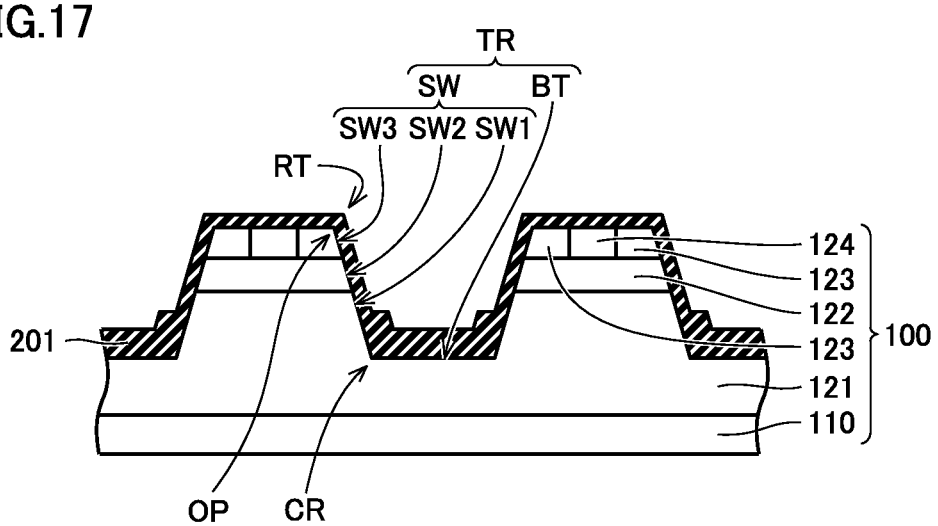
FIG. 17 is a partial cross sectional view schematically showing the thirteenth step of the method for manufacturing the silicon carbide semiconductor device of FIG. 1.

In this way, gate insulating film 201 (FIG. 17) is formed to cover the region extending from opening OP to corner portion CR.

Figure 18:
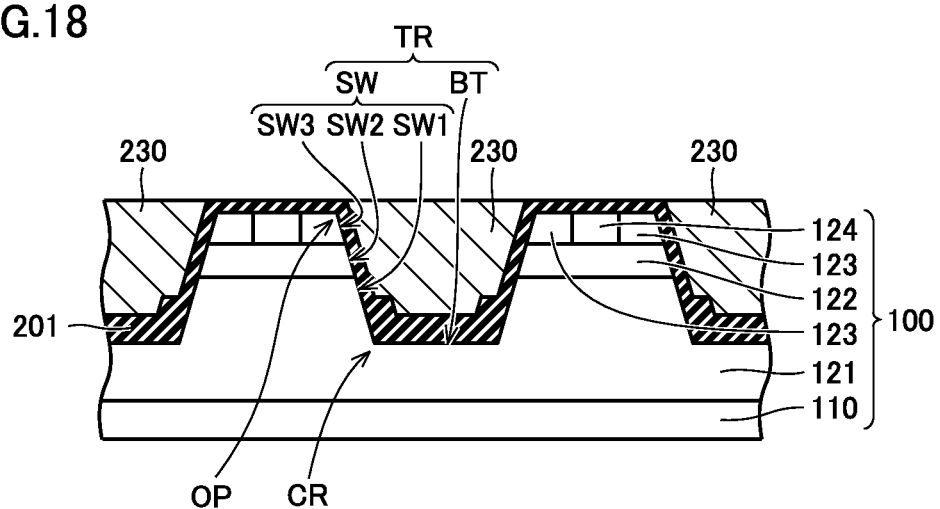
FIG. 18 is a partial cross sectional view schematically showing a fourteenth step of the method for manufacturing the silicon carbide semiconductor device of FIG. 1.

As shown in FIG. 18, gate electrode 230 is formed on trench TR with gate insulating film 201 being interposed therebetween. A method for forming gate electrode 230 can be performed by, for example, forming a film of conductor or doped polysilicon and performing CMP (Chemical Mechanical Polishing).

Referring to FIG. 1 again, interlayer insulating film 203 is formed on gate electrode 230 and gate insulating film 201 so as to cover the exposed surface of gate electrode 230. Etching is performed to form an opening in interlayer insulating film 203 and gate insulating film 201. Through the opening, each of n region 123 and contact region 124 is exposed on the upper surface of the mesa structure. Next, on the upper surface of the mesa structure, source electrode 221 is formed in contact with each of n region 123 and contact region 124. Source interconnection 222, drain electrode 211, and protecting electrode 212 are formed. In this way, MOSFET 501 is obtained.

According to the present embodiment, gate insulating film 201 (FIG. 16) formed by thermally oxidizing trench TR provided with corner insulating film 201R (FIG. 15) is made thick at corner portion CR of trench TR by a thickness corresponding to the thickness of corner insulating film 201R. Therefore, corner portion CR does not need to be made thick by thermal oxidation. Thus, it is not necessary to actively cause a phenomenon in which the thermal oxidation rate differs depending on crystal orientation. Hence, there can be employed thermal oxidation (FIG. 16) at not less than 1300° C. at which such a phenomenon hardly takes place. By thus selecting the temperature of thermal oxidation, it is possible to suppress the phenomenon in which gate insulating film 201 becomes thin near opening OP of trench TR. Therefore, sufficient insulation reliability of the gate insulating film can be secured near opening OP.

Figure 19:
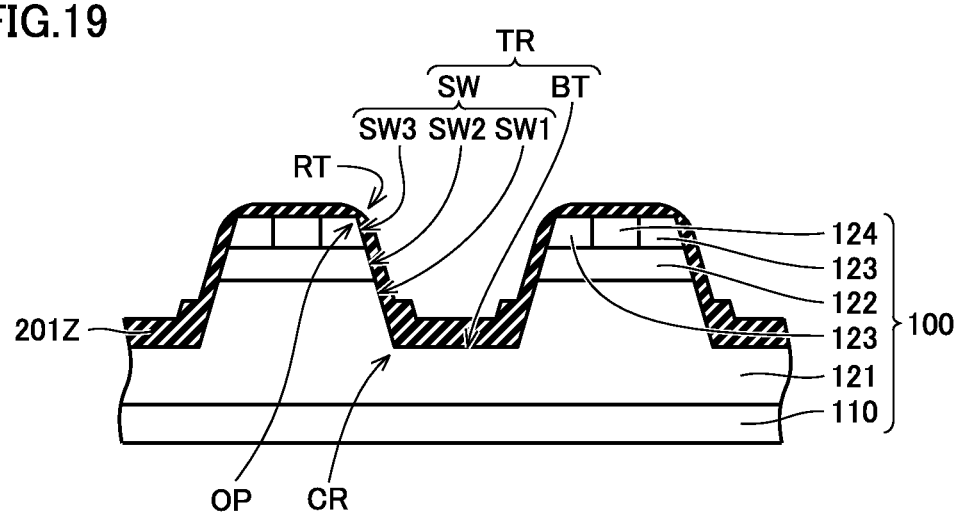
FIG. 19 is a partial cross sectional view showing one step of a method for manufacturing a silicon carbide semiconductor device of a Comparative Example.

It should be noted that if the insulating film on opening OP is formed only by performing thermal oxidation at less than 1300° C., the insulating film has a small thickness near opening OP as in a gate insulating film 201Z (FIG. 19).

Preferably, when trench TR provided with corner insulating film 201R is thermally oxidized, the temperature of epitaxial substrate 100 is increased from a temperature of less than 1300° C. to a temperature of not less than 1300° C. in a non-oxidizing atmosphere, and then the atmosphere surrounding epitaxial substrate 100 is changed from the non-oxidizing atmosphere to an oxidizing atmosphere while maintaining the temperature of epitaxial substrate 100 at not less than 1300° C. More preferably, the atmosphere surrounding epitaxial substrate 100 is changed from the oxidizing atmosphere to a non-oxidizing atmosphere while maintaining the temperature of epitaxial substrate 100 at not less than 1300° C., and then epitaxial substrate 100 is cooled from the temperature of not less than 1300° C. to a temperature of not more than 1000° C. while maintaining, as the non-oxidizing atmosphere, the atmosphere surrounding epitaxial substrate 100. Accordingly, the thermal oxidation can be more sufficiently performed at not less than 1300° C.

When changing the atmosphere surrounding epitaxial substrate 100 from the non-oxidizing atmosphere to the oxidizing atmosphere, oxygen gas is preferably introduced into the atmosphere surrounding epitaxial substrate 100. In this way, the change can be made readily from the non-oxidizing atmosphere to the oxidizing atmosphere.

Preferably, when forming corner insulating film 201R (FIG. 15), covering insulating film 201Q is formed (FIG. 11) to cover the region extending from opening OP to corner portion CR, and is patterned (FIG. 12 to FIG. 14). In this way, corner insulating film 201R can be formed from the film covering the region extending from opening OP to corner portion CR.

Preferably, when patterning covering insulating film 201Q, covering insulating film 201Q is etched using, as a mask, resist layer 402 (FIG. 13) patterned by etch back. Accordingly, covering insulating film 201Q can be patterned readily. Covering insulating film 201Q is preferably etched by wet etching. Accordingly, the etching is performed by chemical etching rather than physical etching. Therefore, the etching does not provide physical damage to epitaxial substrate 100.

Preferably, when forming covering insulating film 201Q (FIG. 11), silicon film 302P is formed on trench TR (FIG. 9) and is thermally oxidized (FIG. 10). Accordingly, covering insulating film 201Q can be formed from silicon film 302P. Moreover, because not only silicon film 302P but also thermal oxidation film 201P are formed, covering insulating film 201Q can be made thicker.

Silicon film 302P is preferably thermally oxidized at less than 1300° C., in particular, is more preferably thermally oxidized at less than 1100° C. Accordingly, insulating property can be suppressed from being deteriorated due to generation of SiO by reaction between thermal oxidation film 201P and silicon film 302P. Moreover, in order to proceed the thermal oxidation at a practically sufficient rate, silicon film 302P is preferably thermally oxidized at more than 900° C. Moreover, in order to reduce stress stored in the thermal oxidation film, silicon film 302P is preferably thermally oxidized at more than 1000° C., which is a temperature with which the thermal oxidation film can be made soft.

Second Embodiment

Figure 20:
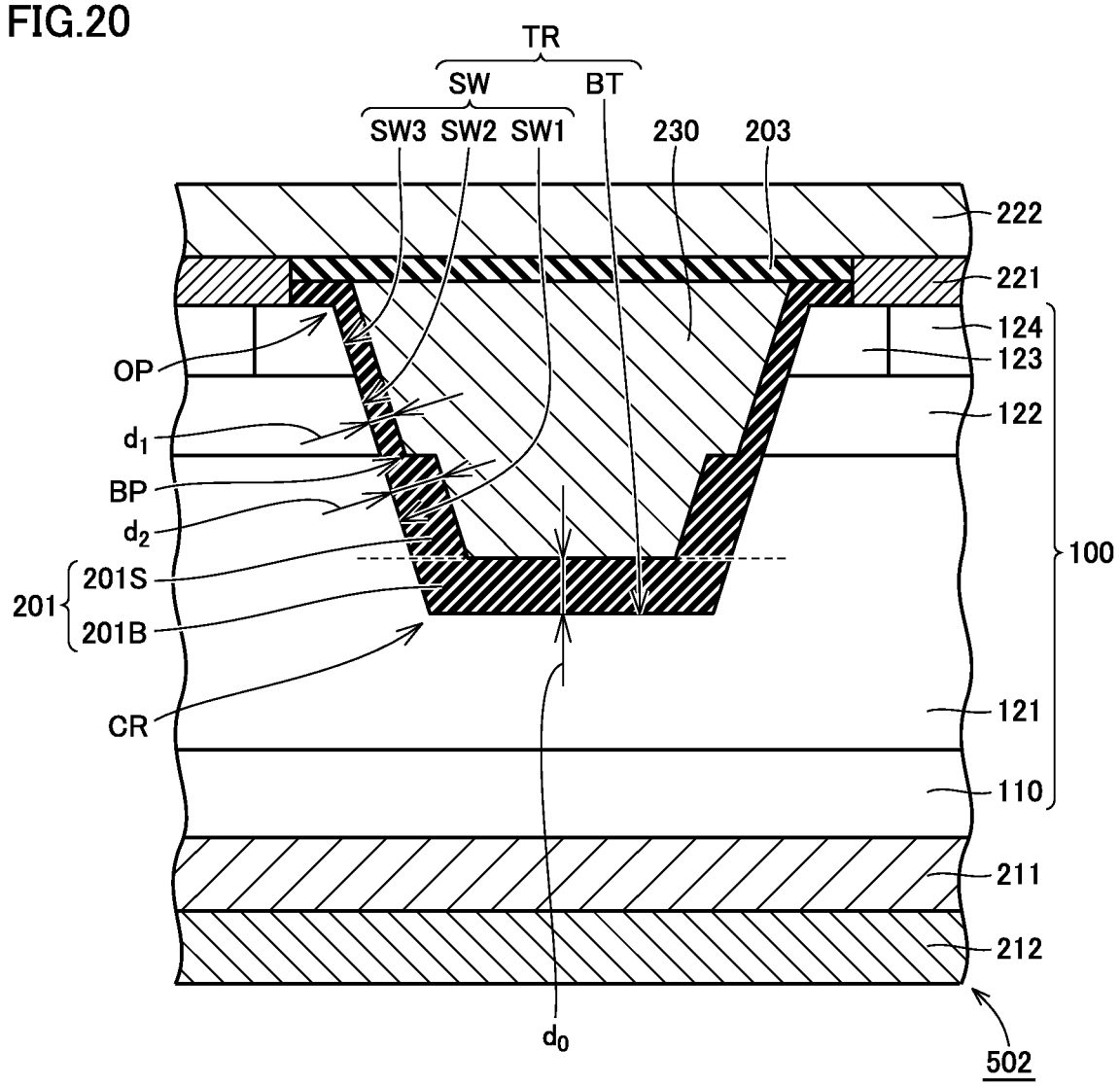
FIG. 20 is a partial cross sectional view schematically showing a configuration of a silicon carbide semiconductor device in a second embodiment of the present invention.

As shown in FIG. 20, in a MOSFET 502 (silicon carbide semiconductor device) of the present embodiment, unlike the first embodiment (FIG. 3), boundary portion BP is located on the boundary between side surfaces SW1 and SW2. The expression "located on the boundary" herein is intended to permit an error of, specifically, about ±0.1 μm, rather than permitting no production error at all. Boundary portion BP can be positioned in this way by, for example, suppressing a degree of advance of the etch back step (FIG. 12 and FIG. 13) in the first embodiment. Apart from the configuration described above, the configuration of the present embodiment is substantially the same as the configuration of the first embodiment. Hence, the same or corresponding elements are given the same reference characters and are not described repeatedly.

By positioning boundary portion BP as described above, side wall portion 201S of gate insulating film 201 connects between p type body layer 122 and bottom portion 201B on side surface SW1 by a portion having a thickness more than thickness $d_1$. Accordingly, the portion of side wall portion 201S on side surface SW1 has a thickness more than thickness $d_1$ in a wider range. Therefore, dielectric breakdown of gate insulating film 201 can be prevented more securely near corner portion CR of trench TR.

Side wall portion 201S of gate insulating film 201 may connect between p type body layer 122 and bottom portions 201B on side surface SW1 by a portion having thickness $d_2$. Accordingly, the portion of side wall portion 201S on side surface SW1 has a thickness $d_2$ more than thickness $d_1$ in a wider range. Therefore, the dielectric breakdown of gate insulating film 201 can be prevented more securely near corner portion CR of trench TR.

(Surface Having Special Plane)

Figure 21:
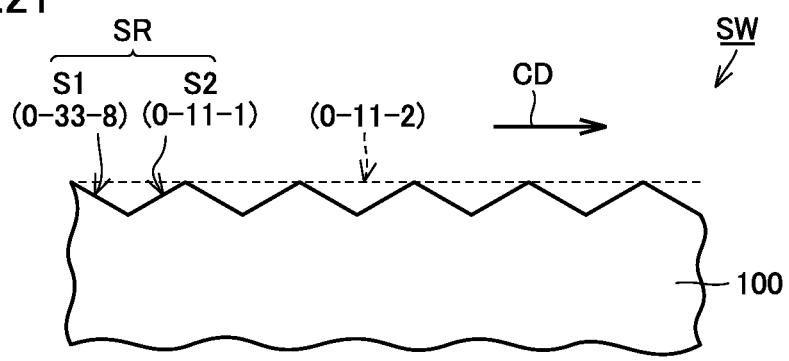
FIG. 21 is a partial cross sectional view schematically showing a fine structure in a surface of the silicon carbide substrate included in the silicon carbide semiconductor device.

As described above, side wall surface SW (FIG. 3) of trench TR, in particular, side surface SW2 preferably has a predetermined crystal plane (also referred to as "special plane"). Such a side wall surface SW includes a plane S1 (first plane) having a plane orientation of {0-33-8} as shown in FIG. 21. Plane S1 preferably has a plane orientation of (0-33-8).

More preferably, side wall surface SW microscopically includes plane S1 and side wall surface SW microscopically further includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Plane S2 preferably has a plane orientation of (0-11-1).

Preferably, plane S1 and plane S2 of side wall surface SW constitutes a combined plane SR having a plane orientation of {0-11-2}. Specifically, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

Next, a detailed structure of combined plane SR will be illustrated.

Figure 22:
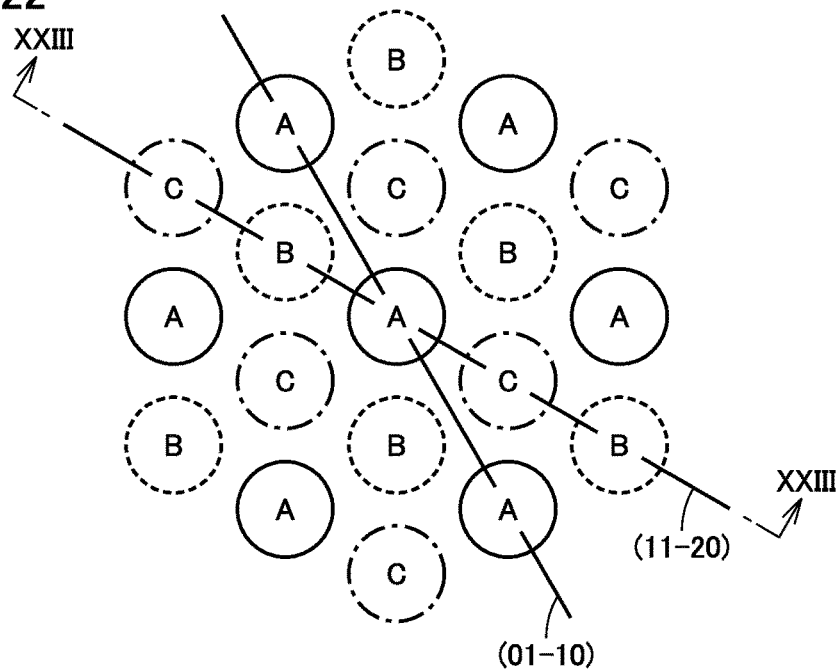
FIG. 22 shows a crystal structure of a (000-1) plane in a hexagonal crystal of polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 22. In other words, with four layers ABCB being regarded as one period, a periodic stacking structure such as ABCBABCBABCB . . . is provided.

Figure 23:
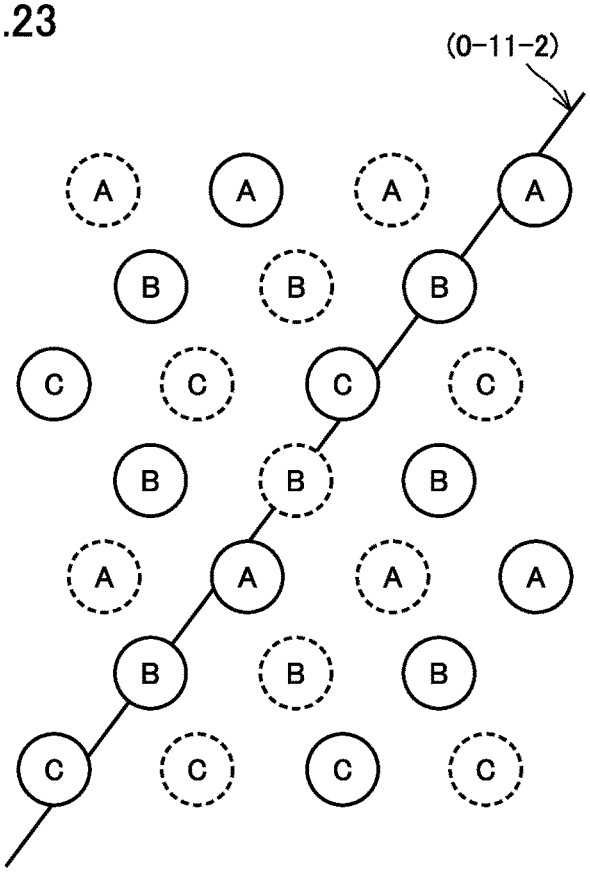
FIG. 23 shows a crystal structure of a (11-20) plane along a line XXIII-XXIII of FIG. 22.

As shown in FIG. 23, in the (11-20) plane (cross section taken along a line XXIII-XXIII of FIG. 22), atoms in each of four layers ABCB constituting the above-described one period are not aligned completely along the (0-11-2) plane. In FIG. 23, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 24:
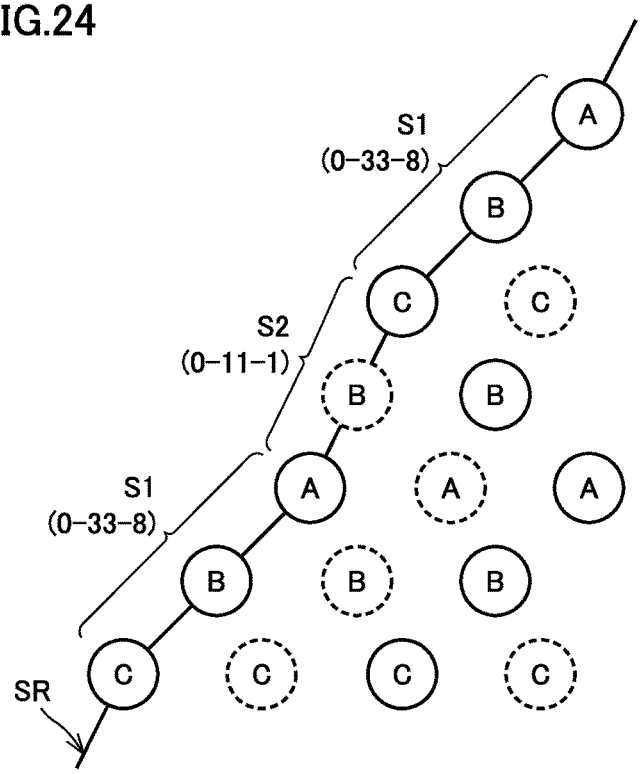
FIG. 24 shows a crystal structure in the vicinity of a surface with a combined plane of FIG. 21 within a (11-20) plane.

As shown in FIG. 24, combined surface SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 23).

Figure 25:
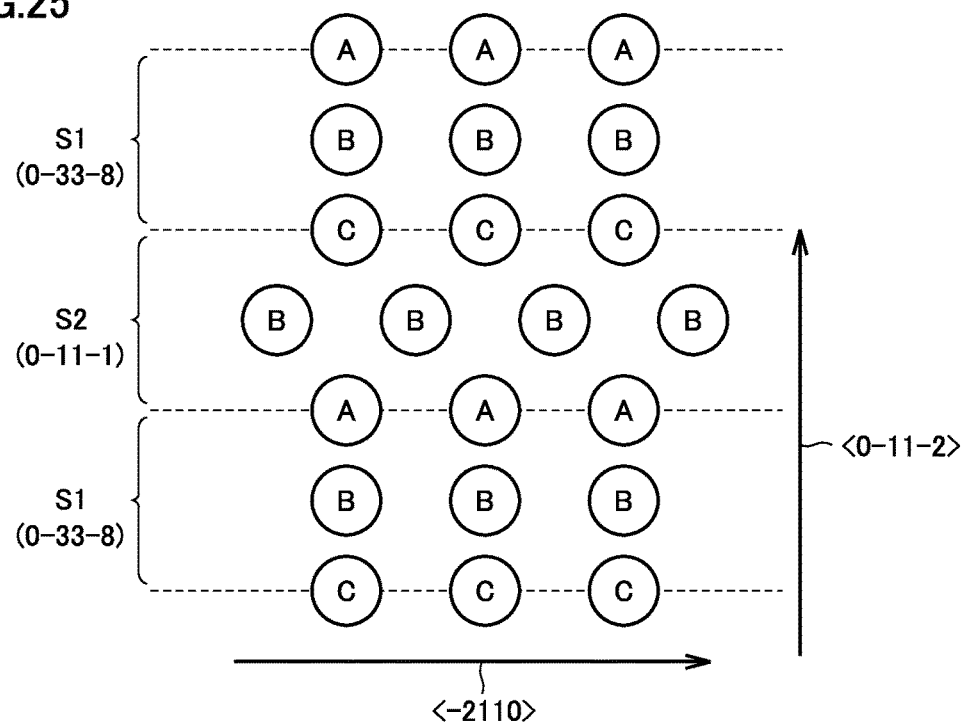
FIG. 25 shows the combined plane of FIG. 21 when viewed from a (01-10) plane.

As shown in FIG. 25, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 25) having a plane orientation of (001) in the structure equivalent to the cubic structure and the planes (planes S2 in FIG. 25) connected to the foregoing planes and having a plane orientation different from that of each of the foregoing planes. The polytype may be 6H or 15R, for example.

Figure 26:
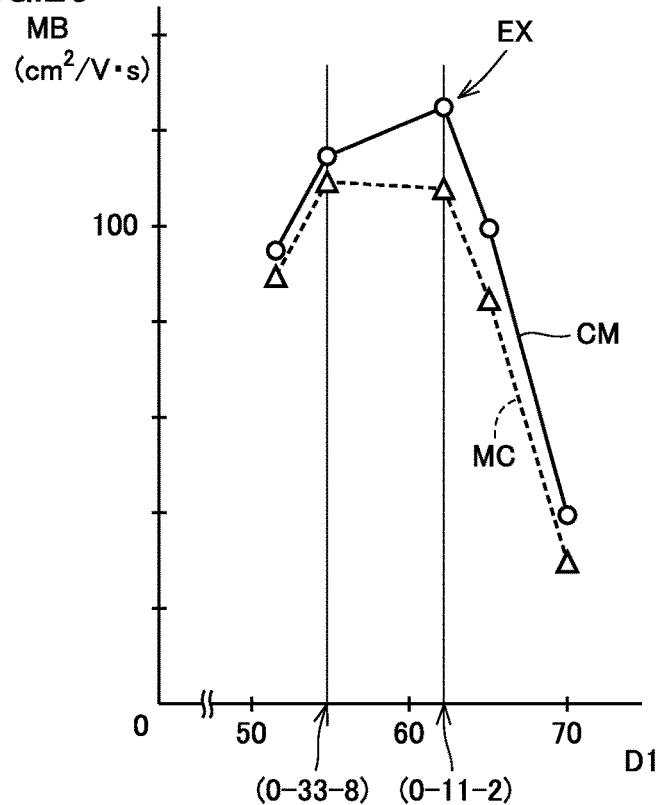
FIG. 26 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 26, the following describes a relation between the crystal plane of side wall surface SW and mobility MB of the channel surface. In the graph of FIG. 26, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 24 and FIG. 25, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 27:
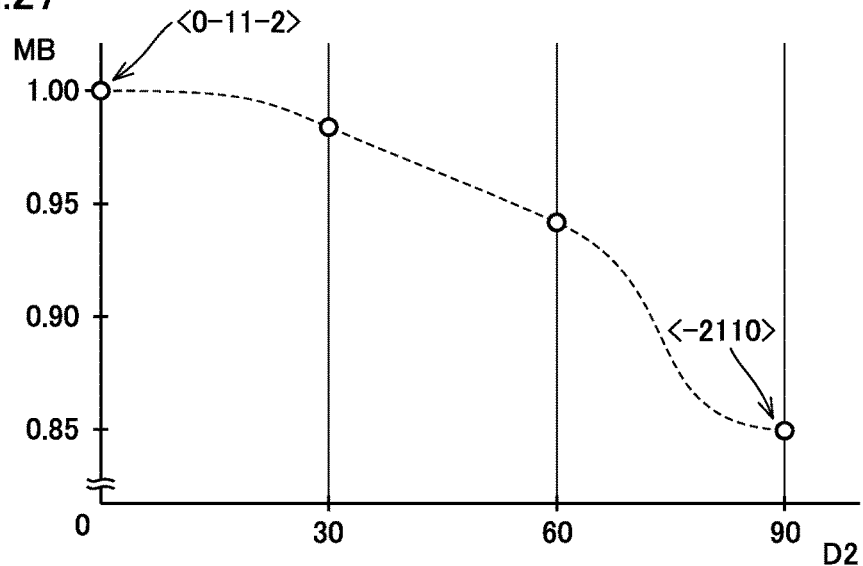
FIG. 27 is a graph showing an exemplary relation between the channel mobility and an angle between a channel direction and a <0-11-2> direction.

It should be noted that mobility MB has orientation dependency on combined plane SR. In a graph shown in FIG. 27, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 21) preferably has an angle D2 of not less than 0° and not more than 60°, more preferably, substantially 0°.

Figure 28:
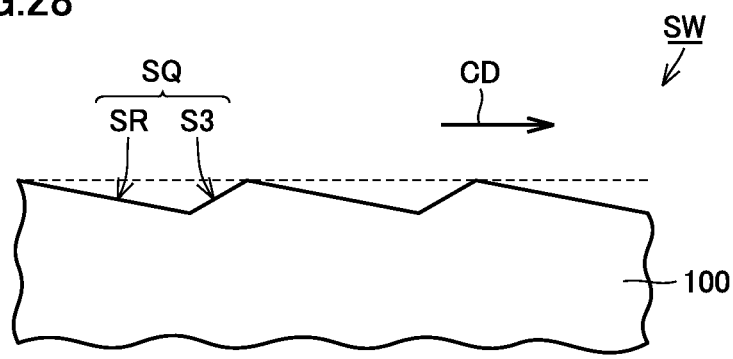
FIG. 28 shows a modification of FIG. 21.

As shown in FIG. 28, side wall surface SW may further include plane S3 (third plane) in addition to combined plane SR. More specifically, side wall surface SW may include a combined plane SQ constituted of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by TEM or AFM, for example.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims. For example, the silicon carbide semiconductor device may be a MISFET (Metal Insulator Semiconductor Field Effect Transistor) other than the MOSFET. Further, the silicon carbide semiconductor device is not limited to the MISFET, and may be, for example, an IGBT (Insulated Gate Bipolar Transistor). Moreover, the first and second conductivity types are not limited to the n type and the p type respectively but may be replaced with each other.

REFERENCE SIGNS LIST

100: epitaxial substrate (silicon carbide substrate); 110: single-crystal substrate; 121: n⁻ layer (first semiconductor layer); 122: p type body layer (second semiconductor layer); 123: n region (third semiconductor layer); 124: contact region; 201: gate insulating film; 201B: bottom portion; 201P: thermal oxidation film; 201Q: covering insulating film; 201R: corner insulating film; 201S: side wall portion; 203: interlayer insulating film; 211: drain electrode; 212: protecting electrode; 221: source electrode; 222: source interconnection; 230: gate electrode; 302P: silicon film; 401: mask; 402: resist layer; 501, 502: MOSFET (silicon carbide semiconductor device); BP: boundary portion; BT: bottom surface; CR: corner portion; OP: opening; SW: side wall surface; SW1 to SW3: side surface (first to third side surfaces); TR: trench.

The invention claimed is:

1. A method for manufacturing a silicon carbide semiconductor device comprising steps of:
   preparing a silicon carbide substrate including a first semiconductor layer, a second semiconductor layer, and a third semiconductor layer, said first semiconductor layer having a first conductivity type, said second semiconductor layer being provided on said first semiconductor layer, said second semiconductor layer having a second conductivity type, said third semiconductor layer being provided on said second semiconductor layer, said third semiconductor layer being separated from said first semiconductor layer by said second semiconductor layer, said third semiconductor layer having said first conductivity type;
   forming a trench having an opening in said silicon carbide substrate, said trench including a bottom surface and a side wall surface, said bottom surface being constituted of said first semiconductor layer, said side wall surface having first to third side surfaces respectively constituted of said first to third semiconductor layers, said trench having a corner portion formed by said first side surface and said bottom surface meeting each other;
   forming a corner insulating film to cover said corner portion and expose a region extending from said opening onto said second side surface;
   forming a gate insulating film to cover a region extending from said opening to said corner portion, the step of forming said gate insulating film including a step of thermally oxidizing said trench provided with said corner insulating film, the step of thermally oxidizing said trench including a step of heating said silicon carbide substrate at not less than 1300° C.; and
   forming a gate electrode on said trench with said gate insulating film being interposed therebetween, wherein
   in said step of forming said corner insulating film, said first side surface and said second side surface are exposed from said corner insulating film, and the step of thermally oxidizing said trench includes steps of:
    increasing a temperature of said silicon carbide substrate from a temperature of less than 1300° C. to a temperature of not less than 1300° C. in a non-oxidizing atmosphere; and
    changing an atmosphere surrounding said silicon carbide substrate from the non-oxidizing atmosphere to an oxidizing atmosphere while maintaining the temperature of said silicon carbide substrate at not less than 1300° C.

2. The method for manufacturing the silicon carbide semiconductor device according to claim 1, wherein
the step of thermally oxidizing said trench includes steps of:
    changing the atmosphere surrounding said silicon carbide substrate from the oxidizing atmosphere to the non-oxidizing atmosphere while maintaining the temperature of said silicon carbide substrate at not less than 1300° C.; and
    cooling said silicon carbide substrate from the temperature of not less than 1300° C. to a temperature of not more than 1000° C. while maintaining, as the non-oxidizing atmosphere, the atmosphere surrounding said silicon carbide substrate.

3. The method for manufacturing the silicon carbide semiconductor device according to claim 1, wherein the step of changing the atmosphere surrounding said silicon carbide substrate from the non-oxidizing atmosphere to the oxidizing atmosphere includes a step of introducing oxygen gas into the atmosphere surrounding said silicon carbide substrate.

4. The method for manufacturing the silicon carbide semiconductor device according to claim 1, wherein
the step of forming said corner insulating film includes steps of:
    forming a covering insulating film to cover the region extending from said opening to said corner portion; and
    patterning said covering insulating film.

5. The method for manufacturing the silicon carbide semiconductor device according to claim 4, wherein
the step of forming said covering insulating film includes steps of:
    forming a silicon film on said trench; and
    thermally oxidizing said silicon film.

6. The method for manufacturing the silicon carbide semiconductor device according to claim 5, wherein the step of forming said covering insulating film includes a step of forming a thermal oxidation film on said trench before the step of forming said silicon film.

7. The method for manufacturing the silicon carbide semiconductor device according to claim 6, wherein the step of thermally oxidizing said silicon film is performed at less than 1300° C.

8. The method for manufacturing the silicon carbide semiconductor device according to claim 4, wherein
the step of patterning said covering insulating film includes steps of:
    forming a resist layer by applying a resist liquid to fill said trench with said covering insulating film being interposed therebetween;
    patterning said resist layer by etching back said resist layer such that said resist layer partially remains on said trench; and
    etching said covering insulating film using said resist layer as a mask after the step of patterning said resist layer.

9. The method for manufacturing the silicon carbide semiconductor device according to claim 8, wherein the step of etching said covering insulating film is performed by wet etching.

10. A method for manufacturing a silicon carbide semiconductor device comprising steps of:
    preparing a silicon carbide substrate including a first semiconductor layer, a second semiconductor layer, and a third semiconductor layer, said first semiconductor layer having a first conductivity type, said second semiconductor layer being provided on said first semiconductor layer, said second semiconductor layer having a second conductivity type, said third semiconductor layer being provided on said second semiconductor layer, said third semiconductor layer being separated from said first semiconductor layer by said second semiconductor layer, said third semiconductor layer having said first conductivity type;
    forming a trench having an opening in said silicon carbide substrate, said trench including a bottom surface and a side wall surface, said bottom surface being constituted of said first semiconductor layer, said side wall surface having first to third side surfaces respectively constituted of said first to third semiconductor layers, said trench having a corner portion formed by said first side surface and said bottom surface meeting each other;
    forming a corner insulating film to cover said corner portion and expose a region extending from said opening onto said second side surface;
    forming a gate insulating film to cover a region extending from said opening to said corner portion, the step of forming said gate insulating film including a step of thermally oxidizing said trench provided with said corner insulating film, the step of thermally oxidizing said trench including a step of heating said silicon carbide substrate at not less than 1300° C.; and
    forming a gate electrode on said trench with said gate insulating film being interposed therebetween, wherein
in said step of forming said corner insulating film, said first side surface and said second side surface are exposed from said corner insulating film, and
the step of forming said corner insulating film includes steps of:
    forming a covering insulating film to cover the region extending from said opening to said corner portion; and
    patterning said covering insulating film.

11. The method for manufacturing the silicon carbide semiconductor device according to claim 10, wherein
the step of forming said covering insulating film includes steps of:
    forming a silicon film on said trench; and
    thermally oxidizing said silicon film.

12. The method for manufacturing the silicon carbide semiconductor device according to claim 11, wherein the step of forming said covering insulating film includes a step of forming a thermal oxidation film on said trench before the step of forming said silicon film.

13. The method for manufacturing the silicon carbide semiconductor device according to claim 12, wherein the step of thermally oxidizing said silicon film is performed at less than 1300° C.

14. The method for manufacturing the silicon carbide semiconductor device according to claim 10, wherein the step of patterning said covering insulating film includes steps of:
- forming a resist layer by applying a resist liquid to fill said trench with said covering insulating film being interposed therebetween;
- patterning said resist layer by etching back said resist layer such that said resist layer partially remains on said trench; and
- etching said covering insulating film using said resist layer as a mask after the step of patterning said resist layer.

15. The method for manufacturing the silicon carbide semiconductor device according to claim 14, wherein the step of etching said covering insulating film is performed by wet etching.

* * * * *